United States Patent
Mueller et al.

(10) Patent No.: US 10,483,128 B2
(45) Date of Patent: Nov. 19, 2019

(54) EPITAXIALLY COATED SEMICONDUCTOR WAFER, AND METHOD FOR PRODUCING AN EPITAXIALLY COATED SEMICONDUCTOR WAFER

(71) Applicant: Siltronic AG, Munich (DE)

(72) Inventors: Timo Mueller, Burghausen (DE); Michael Gehmlich, Weissenborn (DE); Frank Faller, Neuoetting (DE)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 15/545,541

(22) PCT Filed: Oct. 29, 2015

(86) PCT No.: PCT/EP2015/075189
§ 371 (c)(1),
(2) Date: Jul. 21, 2017

(87) PCT Pub. No.: WO2016/116180
PCT Pub. Date: Jul. 28, 2016

(65) Prior Publication Data
US 2018/0047586 A1    Feb. 15, 2018

(30) Foreign Application Priority Data

Jan. 21, 2015  (DE) ........................ 10 2015 200 890

(51) Int. Cl.
*H01L 21/322*   (2006.01)
*B08B 3/08*      (2006.01)
*C30B 25/20*     (2006.01)
*C30B 29/06*     (2006.01)
*C30B 33/10*     (2006.01)
(Continued)

(52) U.S. Cl.
CPC ............ *H01L 21/3225* (2013.01); *B08B 3/08* (2013.01); *C30B 25/20* (2013.01); *C30B 29/06* (2013.01); *C30B 33/10* (2013.01); *H01L 21/0214* (2013.01); *H01L 21/02052* (2013.01); *H01L 21/02249* (2013.01); *H01L 21/02381* (2013.01); *H01L 21/02532* (2013.01); *H01L 21/30625* (2013.01); *H01L 29/16* (2013.01); *H01L 29/32* (2013.01)

(58) Field of Classification Search
None
See application file for complete search history.

(56) References Cited

U.S. PATENT DOCUMENTS 9,458,554 B2    10/2016   Mueller et al.
2002/0022351 A1  2/2002   Schmolke et al.
(Continued)

FOREIGN PATENT DOCUMENTS

DE   10 2012 214 085 A1   5/2014
EP        1 345 262 A1    9/2003
(Continued)

*Primary Examiner* — Long Pham
(74) *Attorney, Agent, or Firm* — Brooks Kushman P.C.

(57) ABSTRACT

Epitaxial wafers with a high concentration of BMD nuclei or developed BMDs just below a denuded zone, and having low surface roughness, are produced by forming an oxynitride layer on a purposefully oxidized epitaxial layer by a short RTA treatment in a nitriding atmosphere, removing the oxynitride layer, and then polishing the epitaxial surface.

5 Claims, 2 Drawing Sheets

Figure 1:
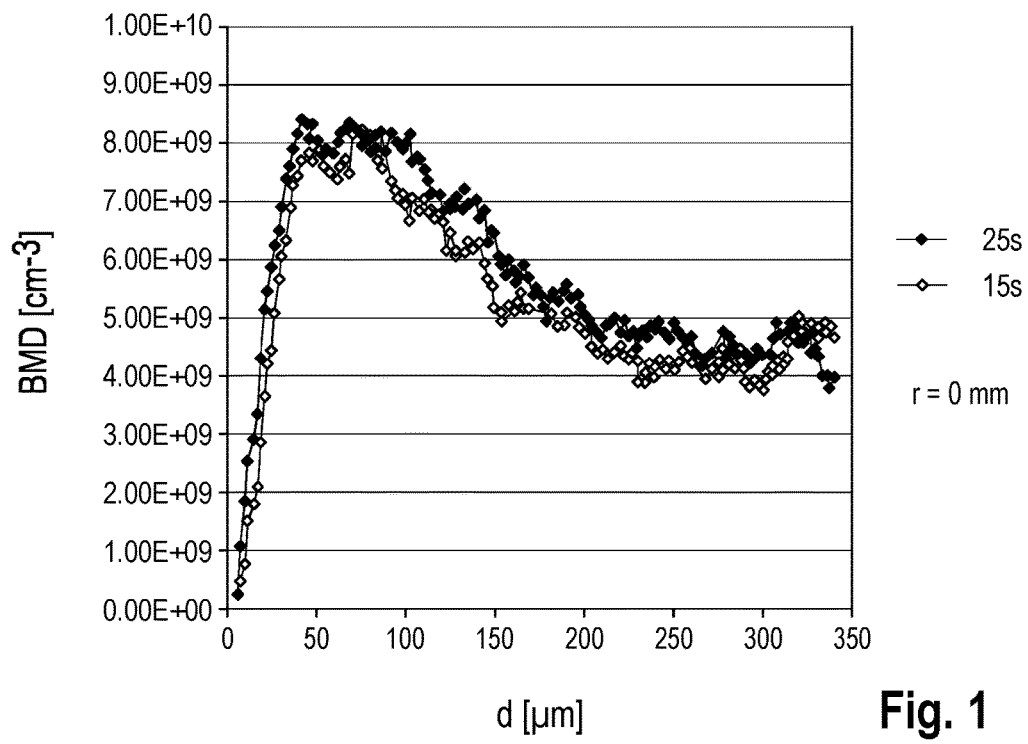

(51) Int. Cl.
*H01L 21/02* (2006.01)
*H01L 21/306* (2006.01)
*H01L 29/16* (2006.01)
*H01L 29/32* (2006.01)

(56) References Cited

U.S. PATENT DOCUMENTS

| | | | |
|---|---|---|---|
| 2002/0127766 A1 | 9/2002 | Ries et al. | |
| 2003/0054641 A1* | 3/2003 | Binns | H01L 21/3225 438/689 |
| 2005/0158969 A1* | 7/2005 | Binns | H01L 21/3225 438/471 |
| 2011/0227202 A1* | 9/2011 | Park | H01L 21/2253 257/618 |
| 2018/0047586 A1* | 2/2018 | Mueller | H01L 21/3225 |

FOREIGN PATENT DOCUMENTS

| | | |
|---|---|---|
| JP | 2003077924 A | 3/2003 |
| JP | 2009170940 A | 7/2009 |

\* cited by examiner

EPITAXIALLY COATED SEMICONDUCTOR WAFER, AND METHOD FOR PRODUCING AN EPITAXIALLY COATED SEMICONDUCTOR WAFER

CROSS REFERENCE TO RELATED APPLICATIONS

This application is the U.S. National Phase of PCT Appln. No. PCT/EP2015/075189 filed Oct. 29, 2015, which claims priority to German Application No. 10 2015 200 890.8 filed Jan. 21, 2015, the disclosures of which are incorporated in their entirety by reference herein.

BACKGROUND OF THE INVENTION

1. Field of the Invention

The invention relates to an epitaxially coated semiconductor wafer comprising a substrate wafer composed of monocrystalline silicon, a polished epitaxial layer composed of silicon on the front side of the substrate wafer, a denuded zone extending from the polished epitaxial layer into the substrate wafer, and a region adjoining the denuded zone and having BMD nuclei. The invention also relates to a method for producing an epitaxially coated semiconductor wafer.

2. Description of the Related Art

A denuded zone is a near-surface region of the epitaxially coated semiconductor wafer in which oxygen precipitates called BMDs (bulk micro defects) are not formed. This region extends from the upper side surface into the bulk of the epitaxially coated semiconductor wafer. The denuded zone is usually provided as a location for accommodating electronic components.

The denuded zone is adjoined by a further region which extends into the bulk of the semiconductor wafer and in which BMD nuclei are present. BMD nuclei are developed into BMDs by means of a thermal treatment. BMDs act as centers of an internal getter which can bind impurities, metallic impurities in particular. The development of BMD nuclei into BMDs is also possible in the course of a thermal treatment which primarily serves for constructing electronic components in the denuded zone.

One trend in the art has pursued the aim of providing the highest possible density of BMDs as near as possible adjoining the denuded zone. A further trend has pursued the aim of restricting the depth of the denuded zone to the amount necessary for the accommodation of electronic components.

It is known that momentary rapid heating and cooling of the semiconductor wafer in an atmosphere having a nitriding effect injects vacancies, and that the presence of vacancies supports the nucleation of BMD nuclei in the bulk of the semiconductor wafer. A thermal treatment by means of momentary rapid heating and cooling is also called RTA treatment (rapid thermal anneal).

US 2002/0127766 A1 describes a method for producing a semiconductor wafer composed of monocrystalline silicon comprising a polished epitaxial layer, a denuded zone and a region having BMD nuclei. The method comprises an RTA treatment after the deposition of an epitaxial layer.

An RTA treatment, in particular applied to epitaxially coated semiconductor wafers, constitutes a thermal loading associated with the problem of causing slip in the crystal lattice. Furthermore, an RTA treatment also increases the roughness of the surface of the epitaxial layer. Typically, the RMS roughness determined by AFM (atomic force microscope) rises, and a comparatively high number of scattered light centers, called LLS defects (localized light scatterers), are detected, wherein the density of these defects is particularly high in the edge region of the surface of the epitaxial layer.

US2002/0022351 A1 proposes smoothing the surface of the substrate wafer before the deposition of the epitaxial layer in the presence of hydrogen chloride gas and a silane source. However, this method has no influence on processes which impair the roughness of the surface of the epitaxial layer after the deposition thereof.

SUMMARY OF THE INVENTION

Therefore, an object of the present invention is to provide an improved method which provides an epitaxially coated semiconductor wafer composed of silicon having particular properties with respect to the denuded zone, BMD nuclei and the roughness of the surface of the epitaxial layer. These and other objects are achieved by means of an epitaxially coated semiconductor wafer, comprising a substrate wafer composed of monocrystalline silicon having a front side and having a rear side;

an epitaxial layer composed of silicon having a polished surface, on the front side of the substrate wafer, wherein the polished surface has an RMS roughness of not more than 0.055 nm relative to a measurement window having an area of 10 μm×10 μm;

a denuded zone extending from the polished surface of the epitaxial layer to the rear side of the substrate wafer as far as a depth which, between a center and an edge of the semiconductor wafer, is not less than 6 μm and not more than 14 μm, and a region adjoining the denuded zone and having BMD nuclei which can develop into BMDs having a peak density of not less than $3.5 \times 10^9$ cm$^{-3}$ at a distance of not more than 70 μm from the polished surface of the epitaxial layer.

DETAILED DESCRIPTION OF THE PREFERRED EMBODIMENTS

The difference in the RMS roughness, determined by AFM in a measurement window having the area of 10 μm×10 μm, between a center zone of the surface and an edge zone of the surface of the epitaxial layer is preferably not more than 5% relative to the roughness in the center zone.

The BMD nuclei are developed into BMDs, for example, by means of a two-stage precipitation-thermal treatment of the epitaxially coated semiconductor wafer at temperatures of 750 to 850° C. for a duration of 1 to 4 h (1$^{st}$ stage) and temperatures of 950 to 1050° C. for a duration of 8 to 20 h (2$^{nd}$ stage). However, the development of the BMD nuclei into BMDs can also be brought about by means of a comparable thermal treatment of the epitaxially coated semiconductor wafer which is performed principally for the purpose of constructing electronic components.

The substrate wafer preferably has a diameter of at least 300 mm and preferably consists of doped monocrystalline silicon. The dopant may be of the n-type, for example phosphorus, or may be of the p-type, for example boron. The degree of doping is preferably n$^-$ in the case of an n-type doping, and preferably p$^+$ in the case of a p-type doping, corresponding to a resistivity in the range of 5 to 80 Ωcm in the case of the n-type doping and of 5 to 20 mΩcm, preferably 10 to 20 mΩcm, in the case of the p-type doping.

An epitaxially deposited and polished layer composed of monocrystalline silicon covers the front side of the substrate wafer. The front side is an upper side surface of the substrate wafer; the rear side is a lower side surface of the substrate wafer. The epitaxially deposited layer is preferably likewise doped, most preferably in such a way that an n/n⁻ or a p/p⁺ epitaxially coated semiconductor wafer is involved. In the unpolished state, the epitaxially deposited layer preferably has a thickness of not less than 1 μm and not more than 12 μm.

Owing to the method for producing the epitaxially coated semiconductor wafer described below, the distribution of the BMD nuclei or of the developed BMDs in the thickness direction of the semiconductor wafer is not symmetrical. The denuded zone has a depth of not less than 6 μm and not more than 14 μm. In that case, the density of the BMD nuclei or developed BMDs rises up to a peak density with a high rate of rise and falls less steeply to a level that remains virtually unchanged as far as the rear side of the substrate wafer. After development of the BMD nuclei into BMDs, the peak density of BMDs on a radius between the center and the edge of the semiconductor wafer is not less than $3.5 \times 10^9$ $cm^{-3}$ and is at a distance from the polished surface of the epitaxial layer of not more than 70 μm. After development of the BMD nuclei into BMDs, the density of BMDs at a distance of 50 μm from the polished surface of the epitaxial layer is preferably not less than 70% of the peak density. The density of developed BMDs at a distance of 200 μm from the polished surface of the epitaxial layer as far as the rear side of the substrate wafer is preferably not greater than 60% of the peak density.

The invention also relates to a method for producing an epitaxially coated semiconductor wafer, comprising providing a substrate wafer composed of monocrystalline silicon having a front side and having a rear side;

depositing an epitaxial layer composed of silicon on the front side of the substrate wafer;

treating the epitaxial layer with an oxidant;

an RTA treatment of the epitaxially coated semiconductor wafer at a temperature in a temperature range of not less than 1160° C. and not more than 1185° C. for a time period of not less than 15 s and not more than 30 s, wherein the epitaxial layer is exposed to an atmosphere consisting of argon and ammonia and an oxynitride layer forms on the epitaxial layer;

removing the oxynitride layer; and polishing the epitaxial layer.

An appropriate source for the substrate wafers required is that of single crystals composed of silicon, in particular, crystals which were pulled in accordance with the CZ method. In that method, silicon is melted in a crucible composed of quartz and the single crystal grows at the end of a seed crystal which is dipped into the resultant melt and is raised. The crucible material is partly dissolved by the melt and in this way provides oxygen that is required later for developing BMDs.

The substrate wafer is sliced from the single crystal together with a multiplicity of further substrate wafers and subjected to mechanical, chemical and chemical-mechanical processing steps, preferably in order to obtain a substrate wafer whose front side and rear side are as flat as possible and are parallel to one another. Particular preference is given to a substrate wafer having a front side and a rear side, wherein at least the front side is present in a polished state, and having an edge between the front side and the rear side, which is likewise polished.

The substrate wafer contains interstitial oxygen, preferably having a concentration of not less than $4.5 \times 10^{17}$ atoms/cm³ and preferably not more than $7.0 \times 10^{17}$ atoms/cm³ with the use of the calibration factor in accordance with New ASTM. The elements carbon and nitrogen can be present in the substrate wafer, but preferably not in a concentration that is usually achievable only by intentional addition of such elements. Accordingly, the concentration of carbon is preferably not more than $8.0 \times 10^{15}$ atoms/cm³ and the concentration of nitrogen is preferably not more than $1.0 \times 10^{12}$ atoms/cm³. Although the intentional addition of the stated elements would facilitate the formation of BMD nuclei, it should not be carried out, in order to restrict the possibility of the formation of stacking faults (OSF defects) and in order not to impair the electrical properties of the substrate wafer.

The polished front side of the substrate wafer is epitaxially coated, preferably by means of CVD (chemical vapor deposition) and preferably in a single-wafer reactor. The coating of the substrate wafer in the single-wafer reactor can be carried out in a known manner, for example as described in US 2010/0213168 A1. A preferred deposition gas contains trichlorosilane as silicon source. The deposition temperature is then preferably not less than 1110° C. and not more than 1180° C., more preferably 1130° C. Furthermore, the deposition gas preferably contains a dopant of the n-type or p-type. The thickness of the deposited epitaxial layer is preferably not less than 1 μm and not more than 12 μm. The result of this method step is an epitaxially coated semiconductor wafer composed of monocrystalline silicon.

To prepare for the RTA treatment, the semiconductor wafer is preferably cleaned and the epitaxially deposited layer is treated with an oxidant that oxidizes the exposed surface of the epitaxial layer. The thickness of the resultant oxide layer is greater than the thickness of a native oxide. Preferably, an RCA cleaning is carried out, comprising the treatment of the semiconductor wafer firstly with SC-1 cleaning solution containing ammonium hydroxide, hydrogen peroxide and water and then with SC-2 cleaning solution containing hydrogen chloride, hydrogen peroxide and water. The subsequent oxidizing treatment of the epitaxially deposited layer is preferably carried out using ozone as an oxidant.

The RTA treatment of the epitaxially coated semiconductor wafer that follows the oxidation comprises rapidly heating said wafer to a temperature in a temperature range of not less than 1160° C. and not more than 1185° C., preferably to a temperature of 1170° C., and keeping the epitaxially coated semiconductor wafer at this temperature for a time period of not less than 15 s and not more than 30 s. The epitaxially coated semiconductor wafer is heated from a starting temperature, which is preferably in the range of 550° C. to 650° C., with a rate of rise of temperature that is preferably not less than 20° C./s and not more than 100° C./s. A rate of rise of temperature in the range of 35 to 75° C./s is particularly preferred.

The temperature of the RTA treatment should be as low as possible in order to avoid the occurrence of slip. The RTA treatment is therefore performed in such a way that the epitaxial layer treated with the oxidant is exposed to an atmosphere consisting of a mixture of argon and ammonia. The ratio of argon:ammonia is preferably 10:1 to 24:1, more preferably 20:1. In this atmosphere, the intended injection of vacancies can be initiated at a lower temperature than in an atmosphere of nitrogen.

In order to minimize the loading of the epitaxially coated semiconductor wafer by the RTA treatment, it is preferred for the rear side of the epitaxially coated semiconductor wafer and thus the rear side of the substrate wafer, during the RTA treatment, to be exposed to an atmosphere which has no or hardly any nitriding effect at the temperature of the RTA treatment. A suitable atmosphere preferably consists of nitrogen. This measure additionally reduces the risk of slip arising.

At the end of the RTA treatment, the epitaxially coated semiconductor wafer is cooled rapidly, preferably to a temperature of not more than 500° C. For this purpose it suffices to switch off the radiant heating of the RTA apparatus.

On account of the RTA treatment of the epitaxially coated semiconductor wafer in the atmosphere consisting of argon and ammonia, a layer which contains silicon oxynitride and is referred to hereinafter as an oxynitride layer forms from the oxide layer on the epitaxial layer. The oxynitride layer is removed, preferably by etching. An aqueous etchant containing not less than 0.8% and not more than 2.0% hydrogen fluoride is preferably used as the etchant. Removing the oxynitride layer by means of polishing is not provided because the roughness of the front side would be increased and particles would be generated as a result.

The epitaxially deposited layer is polished only after the oxynitride layer has been removed. Chemo mechanical polishing (CMP) with a material removal of not less than 0.05 μm and not more than 0.2 μm is preferred, and may be performed by using, e.g. a polishing tool offered by Applied Materials Inc. After CMP, the epitaxially coated semiconductor wafer is expediently subjected to final cleaning.

It is furthermore preferred, after the removal of the oxynitride layer and before CMP, firstly to clean the epitaxially coated semiconductor wafer and then to treat it with an oxidant, preferably with ozone. Particular preference is again given to an RCA cleaning comprising the treatment of the semiconductor wafer firstly with SC-1 cleaning solution and then with SC-2 cleaning solution.

The invention is explained in further detail below on the basis of examples and with reference to drawings.

Double-side polished substrate wafers composed of monocrystalline silicon having a diameter of 300 mm were provided. Substrate wafers in accordance with example B1 contained interstitial oxygen in a concentration of $6.1 \times 10^{17}$ to $6.7 \times 10^{17}$ atoms/cm$^3$ (New ASTM) and were p-type doped with a resistivity of 18 to 19.5 mΩcm. Substrate wafers in accordance with example B2 contained interstitial oxygen in a concentration of $5.3 \times 10^{17}$ to $5.6 \times 10^{17}$ atoms/cm$^3$ (New ASTM) and were n-type doped with a resistivity of 29 to 30 Ωcm. The substrate wafers were processed to form semiconductor wafers having a polished epitaxial layer using a sequence of method steps in accordance with the invention. The epitaxially deposited layer had a thickness of 4 μm (example B1) and respectively 9 μm (example B2). The semiconductor wafers in accordance with example B1 were p/p$^+$ epitaxially coated semiconductor wafers, and those in accordance with example B2 were n/n$^-$ epitaxially coated semiconductor wafers. The epitaxially deposited layers had a resistivity in the range of 29 to 30 Ωcm.

The temperature of the RTA treatment was 1175° C. in the case of all the semiconductor wafers, and the duration of the RTA treatment at this temperature was 15 s and 25 s (example B1) and respectively 15 s, 25 s and 30 s (example B2). All the semiconductor wafers were heated to the temperature of 1175° C. with a rate of rise of temperature of 75° C./s, and the epitaxially deposited layer was treated at this temperature in an atmosphere of argon and ammonia in a ratio of 20:1. Thereafter, the semiconductor wafers were cooled with a cooling rate of of 35° C./s.

After the RTA treatment, the semiconductor wafers were processed further according to the invention to form semiconductor wafers having a polished epitaxial layer and were subsequently subjected to a thermal treatment for the development of BMDs. This thermal treatment was carried out under nitrogen and comprised heating the semiconductor wafers firstly to a temperature of 800° C. for a time period of 3 h and subsequently to a temperature of 1000° C. for a time period of 16 h. The BMD detection was carried out by means of laser light scattering at a fracture edge using a detection instrument of the MO441 type from the Raytex Corporation.

Data regarding the determined depths of the denuded zone and the determined densities of BMDs are entered in table 1 below. The data have the following meaning: "HZ" means the duration of the RTA treatment at the temperature of the RTA treatment;

"DZ1 av." means the depth of the denuded zone averaged over the radius of the semiconductor wafer;

"BMD av." means the density of BMDs averaged over the radius of the semiconductor wafer;

"BMD peak" means the peak density of BMDs determined in the center of the semiconductor wafer; and "BMD 50 μm" means the density of BMDs found at a depth of 50 μm in the radial center of the semiconductor wafer.

TABLE 1

| | B1 | | | | | |
|---|---|---|---|---|---|---|
| HZ [s] | 15 | 15 | 15 | 25 | 25 | 25 |
| DZ1 av. [μm] | 8.4 | 8.6 | 7.7 | 6.3 | 7.4 | 7.1 |
| BMD av. [$10^9$ cm$^{-3}$] | 3.87 | 3.9 | 5.36 | 5.77 | 5.3 | 5.94 |
| BMD peak [$10^9$ cm$^{-3}$] | 6.77 | 6.77 | 7.93 | 8.67 | 8.65 | 8.05 |
| BMD 50 μm [$10^9$ cm$^{-3}$] | 6.08 | 6.02 | 8.23 | 8.02 | 8.77 | 8.4 |

| | B2 | | | | | | | | |
|---|---|---|---|---|---|---|---|---|---|
| HZ [s] | 15 | 15 | 15 | 25 | 25 | 25 | 30 | 30 | 30 |
| DZ1 av. [μm] | 12 | 13.5 | 12.1 | 9.2 | 9.4 | 10.7 | 9.6 | 9.3 | 8.8 |
| BMD av. [$10^9$ cm$^{-3}$] | 4.11 | 3.24 | 3.20 | 5.71 | 4.68 | 4.92 | 5.97 | 5.76 | 6.33 |

TABLE 1-continued

| | | | | | | | | |
|---|---|---|---|---|---|---|---|---|
| BMD peak [$10^9$ cm$^{-3}$] | 6.52 | 5.60 | 5.62 | 8.30 | 7.73 | 8.48 | 8.85 | 8.63 | 8.97 |
| BMD 50 µm [$10^9$ cm$^{-3}$] | 4.68 | 3.68 | 4.03 | 7.28 | 6.42 | 7.02 | 8.57 | 7.80 | 7.68 |

The data concerning "DZ ay." in table 1 show that the depth of the denuded zone decreases with increasing duration of the RTA treatment, and the data concerning "BMD 50 µm" show that the difference with respect to the peak density at the depth of 50 µm becomes smaller and smaller with increasing duration of the RTA treatment. The depth of the denuded zone corresponds at least to the thickness of the epitaxial layer in virtually all cases.

Figure 2:
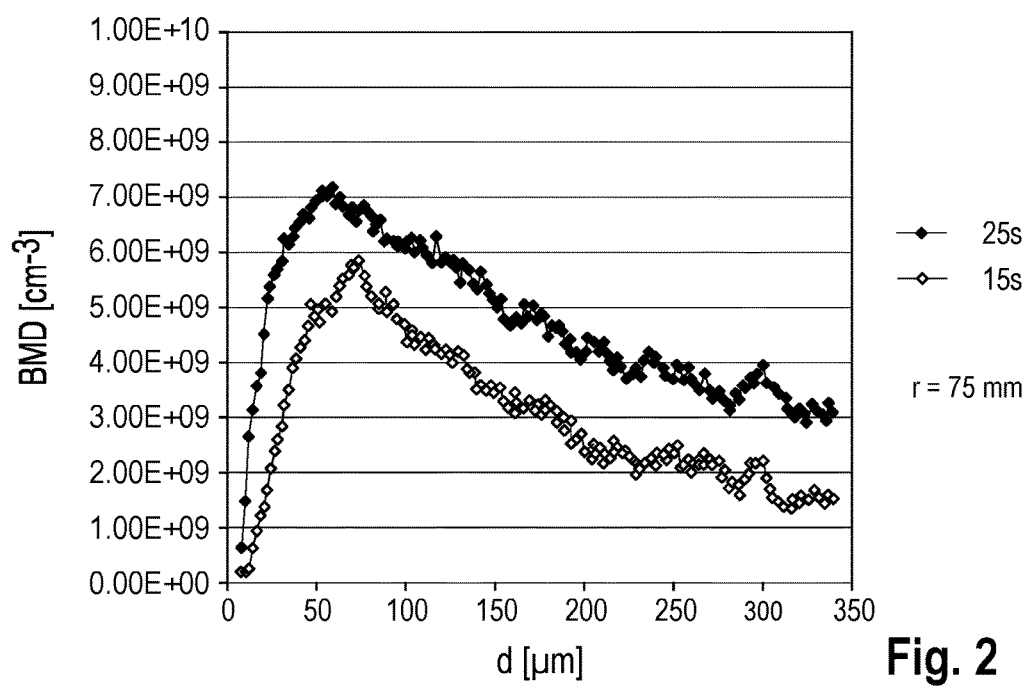
Figure 3:
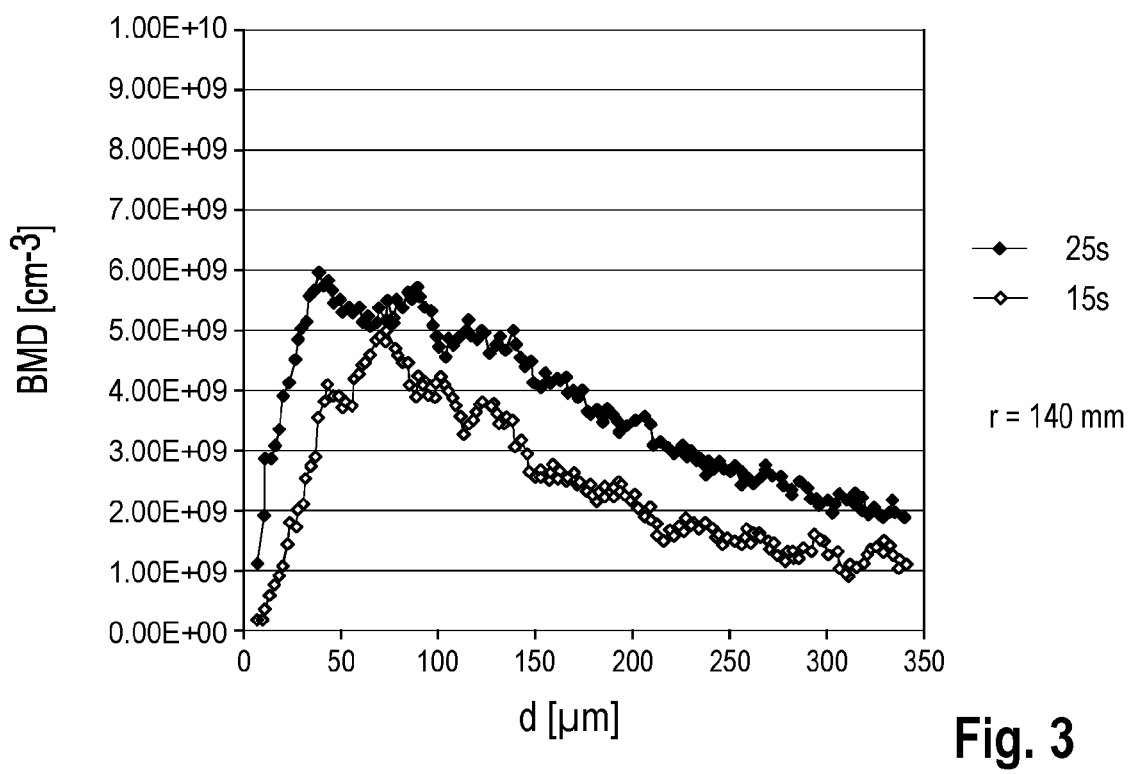

FIG. 1 to FIG. 3 show in a representative manner the depth profile of BMDs for a semiconductor wafer in accordance with example B1 in the radial center (r=0 mm), for radius r=75 mm and for radius r=140 mm.

TABLE 2

| Removal of the oxy-nitride layer | RMS (r = 0 mm) [nm] | RMS (r = 75 mm) [nm] | RMS (r = 140 mm) [nm] | σ [nm] | σ [%] |
|---|---|---|---|---|---|
| no | 0.0525 | 0.057 | 0.0784 | 0.01129 | 18.04 |
| no | 0.0518 | 0.0493 | 0.0626 | 0.00577 | 10.58 |
| yes | 0.0507 | 0.0497 | 0.0521 | 0.00098 | 1.94 |
| yes | 0.0483 | 0.0498 | 0.0495 | 0.00064 | 1.32 |
| yes | 0.0492 | 0.0484 | 0.0494 | 0.00043 | 0.88 |

Table 2 contains values for the RMS roughness relative to a measurement window having an area of 10 µm×10 µm. The data show that the RMS roughness is improved particularly in the edge region of the epitaxially coated semiconductor wafer if the oxynitride layer is removed according to the invention. The standard deviation σ is not more than 5%.

The removal of the oxynitride layer according to the invention is also particularly advantageous with regard to the number of LLS defects which are found on the polished surface after the polishing of the epitaxial layer. Table 3 contains indications concerning the number of scattered light centers having a size of 120 nm or larger which were found before the RTA treatment and after CMP on the surface of the epitaxial layer of two epitaxially coated semiconductor wafers. One of the semiconductor wafers had been produced according to the invention, and the other in almost the same way, but without the removal of the oxynitride layer.

TABLE 3

| Removal of the oxy-nitride layer | LLS defects before RTA treatment [number] | LLS defects after CMP [number] |
|---|---|---|
| no | 6 | 4098 |
| yes | 3 | 3 |

The invention claimed is:

1. An epitaxially coated semiconductor wafer, comprising:
   a substrate wafer comprising monocrystalline silicon having a front side, rear side, a center, and a periphery;
   an epitaxial layer comprising silicon and having a polished surface on the front side of the substrate wafer, wherein the polished surface has an RMS roughness of not more than 0.055 nm in a measurement window having dimensions of 10 µm×10 µm;
   a denuded zone extending from the polished surface of the epitaxial layer to the rear side of the substrate wafer as far as a depth which, between the center and the periphery of the semiconductor wafer, is not less than 6 µm and not more than 14 µm, and
   a region adjoining the denuded zone and having BMD nuclei which can develop into BMDs by heat treatment, with a peak density of BMD nuclei of not less than $3.5 \times 10^9$ cm$^{-3}$ at a distance of not more than 70 µm from the polished surface of the epitaxial layer.

2. The epitaxially coated semiconductor wafer of claim 1, which has BMD nuclei which can develop into BMDs whose density at a distance of 50 µm from the polished surface of the epitaxial layer is not less than 70% of the peak density.

3. The epitaxially coated semiconductor wafer of claim 1, which has BMD nuclei which can develop into BMDs whose density at a distance of 200 µm from the polished surface of the epitaxial layer as far as the rear side of the substrate wafer is not greater than 60% of the peak density.

4. The epitaxially coated semiconductor wafer of claim 2, which has BMD nuclei which can develop into BMDs whose density at a distance of 200 µm from the polished surface of the epitaxial layer as far as the rear side of the substrate wafer is not greater than 60% of the peak density.

5. A method for producing an epitaxially coated semiconductor wafer, comprising:
   providing a substrate wafer comprising monocrystalline silicon, having a front side, a rear side, a center, and a periphery;
   depositing an epitaxial layer comprising silicon on the front side of the substrate wafer; treating the epitaxial layer with an oxidant;
   treating the epitaxially coated semiconductor wafer with an RTA treatment at a temperature in a temperature range of not less than 1160° C. and not more than 1185° C. for a time period of not less than 15 s and not more than 30 s, wherein the epitaxial layer is exposed to an atmosphere consisting of argon and ammonia and an oxynitride layer forms on the epitaxial layer;
   removing the oxynitride layer;
   polishing the epitaxial layer; and
   recovering an epitaxially coated wafer of claim 1.

* * * * *